US006822901B2

(12) United States Patent
Kawamata

(10) Patent No.: US 6,822,901 B2
(45) Date of Patent: Nov. 23, 2004

(54) NON-VOLATILE MEMORY CIRCUIT COMPRISING AUTOMATIC ERASE FUNCTION

(75) Inventor: Junya Kawamata, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 69 days.

(21) Appl. No.: 10/346,123

(22) Filed: Jan. 17, 2003

(65) Prior Publication Data
US 2003/0179604 A1 Sep. 25, 2003

(30) Foreign Application Priority Data
Mar. 20, 2002 (JP) ......................................... 2002-078796

(51) Int. Cl.[7] ............................................. G11C 16/04
(52) U.S. Cl. .............................. 365/185.11; 365/185.29; 365/195
(58) Field of Search ....................... 365/185.11, 185.29, 365/195, 230.03

(56) References Cited

U.S. PATENT DOCUMENTS 5,798,968 A * 8/1998 Lee et al. .............. 365/185.29
6,611,907 B1 * 8/2003 Maeda et al. ................ 711/170

* cited by examiner

Primary Examiner—Van Thu Nguyen
(74) Attorney, Agent, or Firm—Arent Fox

(57) ABSTRACT

A nonvolatile memory circuit, comprises: memory regions, which contain N (N is a plurality) of the sectors, N not being an exponentiated number of two and the sectors having the same capacity; a sector selection circuit for decoding a sector address and selecting the sector which corresponds to the sector address; and a memory control circuit which, in response to an erase command, executes an erase operation to the selected sector and, upon verifying that the erasure is complete, sequentially changes said sector address to select the next sector. When a sector that does not exist in the memory regions is selected, said memory control circuit selects the next sector without performing an erase operation to the nonexistent sector.

12 Claims, 10 Drawing Sheets

NON-VOLATILE MEMORY CIRCUIT
COMPRISING AUTOMATIC ERASE
FUNCTION

CROSS-REFERENCE TO RELATED APPLICATIONS

This application is based upon and claims the benefit of priority from the prior Japanese Patent Application No. 2002-78796, filed on Mar. 20, 2002, the entire contents of which are incorporated herein by reference.

BACKGROUND OF THE INVENTION

1. Field of the Invention

The present invention relates to a nonvolatile memory circuit comprising an automatic erase function, and more particularly to a nonvolatile memory circuit that has a memory capacity which is not an exponentiated number of two and that is capable of preventing hangup during an erase operation.

2. Description of the Related Art

In response to readout, programming and erase control commands which are supplied from the outside, flash memory, which is semiconductor nonvolatile memory, executes operations that correspond to such commands. More particularly, erase commands include chip erase commands, which erase all the sectors in the memory regions, and sector erase commands which erase designated sectors thereof. Memory regions comprise a plurality of sectors and a plurality of memory cells are provided in each sector.

On account of being nonvolatile memory, flash memory stores data contents which need to be kept for long periods such as system programs and control data, and the like. Flash memory therefore comprises a protect memory for storing protection information so that the data contents are not erased by mistake. The protect memory, which corresponds to each sector, stores protected states for prohibiting erasure of these sectors and unprotected states enabling erasure of these sectors. Further, before erasing given sectors in response to an erase command, the protection information in the protect memory which corresponds to these sectors is checked such that an erase operation is performed only to those sectors which are in an unprotected state.

FIG. 1 is a schematic constitutional view of a conventional flash memory. Memory arrays 14, which comprise a plurality of memory cells, comprise a plurality of sectors 0 to n, and the outputs of the sectors are supplied to a sense amp/verify circuit 18. A protect memory 16 for storing protection information P(0) to P(n) which corresponds to each of the sectors is also provided, and protect signals Pout, which represent the protection information read out from the protect memory 16, are supplied to a memory control circuit 20. The memory control circuit 20 is a type of processor known as a state machine which controls memory readout, programming and erasure in response to a given control command CMD.

A circuit which especially relates to erase operations is shown in FIG. 1. The memory control circuit 20 sets a sector address counter 10 to the maximum address in response to a chip-erase command. A sector address group SAdd, which is outputted by the sector address counter 10, is supplied to a decoder 12. The decoder 12 decodes the sector address group and then controls any one of sector select signals SEC0 to SECn to the activation level. Protection information in the protect memory 16 which corresponds to the sector select signal at the activation level is read out, whereupon a protect signal Pout is supplied to the memory control circuit 20.

Upon confirming that this protect signal Pout represents an unprotected state, the memory control circuit 20 supplies an erase signal S21 to the erase circuit 22 such that erase stress is applied to the selected sector. After the erase stress is applied, erase verification for the erasure of this sector is conducted by the verify circuit 18 and a verify result signal S18 is supplied to the memory control circuit 20. In the erase verification, if it cannot be verified that the erasure of all the memory cells in the sector is complete, the above-described erase stress application and erase verification are repeated. When the erase verification yields a pass, the memory control circuit 20 supplies a decrement signal S20 to thereby decrement the sector address counter 10.

On the other hand, upon detecting the fact that the protect signal Pout represents a protected state, the memory control circuit 20 does not erase this sector, but decrements the sector address counter 10 by means of the decrement signal S20 to thereby decrement the sector address group SAdd, and moves to an erase operation to the next sector. In the next sector also, the protection information is confirmed, and if this protection information represents an unprotected state, the memory control circuit 20 performs the erase operation, but in the case of a protected state, the memory control circuit 20 skips the erase operation.

The memory cells of the flash memory are, for example, constituted by MOS transistors that comprise a floating gate. A low threshold voltage state in which charge is not stored in this floating gate corresponds to an erased state (data "1"), and a high threshold voltage state in which charge is stored in this floating gate corresponds to a programmed state (data "0").

Here, in an erase operation, erase stress is applied to a memory cell to thereby extract charge from the floating gate, such that the threshold voltage drops. Consequently, when the charge in the floating gate is adequately extracted, the threshold voltage drops sufficiently and a drain current flows in the cell transistor, which yields a pass in the erase verification. In cases where the charge extraction is not completed despite the erase stress being applied a predetermined number of times, subsequent erase stress application is not performed, and a hangup signal indicating this fact is generated internally. The fact that an erase error has occurred is communicated by outputting this hangup signal to the outside. Once a hangup signal is outputted, the memory chip is considered to be defective and can no longer be used.

Flash memory normally has a memory capacity that is an exponentiated number of two. For example, when the data bus width is 8 bits and an address is 24 bits, a flash memory has a 16 megabyte or 128 megabit capacity. That is, 128 megabits are equivalent to $2^{27}$. Here, if the capacity of each sector is the same, the number of sectors is also an exponentiated number of two, such that for a chip erase operation, all the sectors are selected by sequentially decrementing the sector address from a maximum value to a minimum value.

FIG. 2 shows a flash memory that has a memory capacity that is not an exponentiated number of two. The flash memory shown in this figure is also constituted having a data bus width of 8 bits and addresses A0 to A23 of 24 bits, but the memory regions only total 96 megabits (12 megabytes), that is, $2^{26} < 96$ megabits $< 2^{27}$. In the figure, the memory A regions, which are indicated using solid lines, are 64 megabytes and 32 megabytes respectively, and are memory regions that actually exist. Further, the memory B region (32 megabytes), which is indicated using a dotted line, exists as an address space but does not actually exist. Such a memory is sometimes employed in cases where special restrictions exist in the system in which this memory is installed.

In a memory of this kind which has a memory capacity that is not an exponentiated number of two, the sector (n) and sector (n−1) in FIG. 1 do not exist, for example. Consequently, in response to a chip-erase control command, and, the sector select signals SECn to SEC0 are scanned by sequentially decrement the sector address counter 10. When the sector select signals SECn and SECn−1 are selected, because the sector (n) and sector (n−1) which correspond to these sector select signals SECn and SECn−1 do not actually exist, same cannot pass the erase verification. As a result, a hangup state (erase error) is assumed even though such chip is not defective.

Therefore, if the constitution is such that, at the time of a chip erase operation, a sector address is sequentially decremented (or incremented) such that sectors are selected in sequence, in a memory having a memory capacity that is not an exponentiated number of two, it is to be expected that, when nonexistent sectors are selected, the erase verification will not yield a pass and an erase error will occur.

SUMMARY OF THE INVENTION

Accordingly, an object of the present invention is to provide a nonvolatile memory circuit that is capable of preventing the above-described occurrence of an erase error.

In order to achieve the above object, one aspect of the present invention is a nonvolatile memory circuit, comprising: memory regions, which contain N (N is a plurality) of the sectors, N not being an exponentiated number of two and the sectors having the same capacity; a sector selection circuit for decoding a sector address and selecting the sector which corresponds to the sector address; and a memory control circuit which, in response to an erase command, executes an erase operation to the selected sector and, upon verifying that the erasure is complete, sequentially changes said sector address to select the next sector, wherein, when a sector that does not exist in the memory regions is selected, said memory control circuit selects the next sector without performing an erase operation to the nonexistent sector.

According to the above aspect of the invention, when a sector that does not exist in the memory regions is selected, because the memory control circuit selects the next sector without performing an erase operation to the nonexistent sector, the memory control circuit is capable of preventing the occurrence of an erase error due to a non-verification of the erasure completion, when this nonexistent sector is selected.

DESCRIPTION OF THE PREFERRED EMBODIMENTS

The embodiments of the present invention will be described hereinbelow with reference to the drawings. However, the scope of protection of the present invention is not limited to or by the embodiments hereinbelow, but rather covers the inventions defined in the claims as well as any equivalents thereof.

Figure 1:
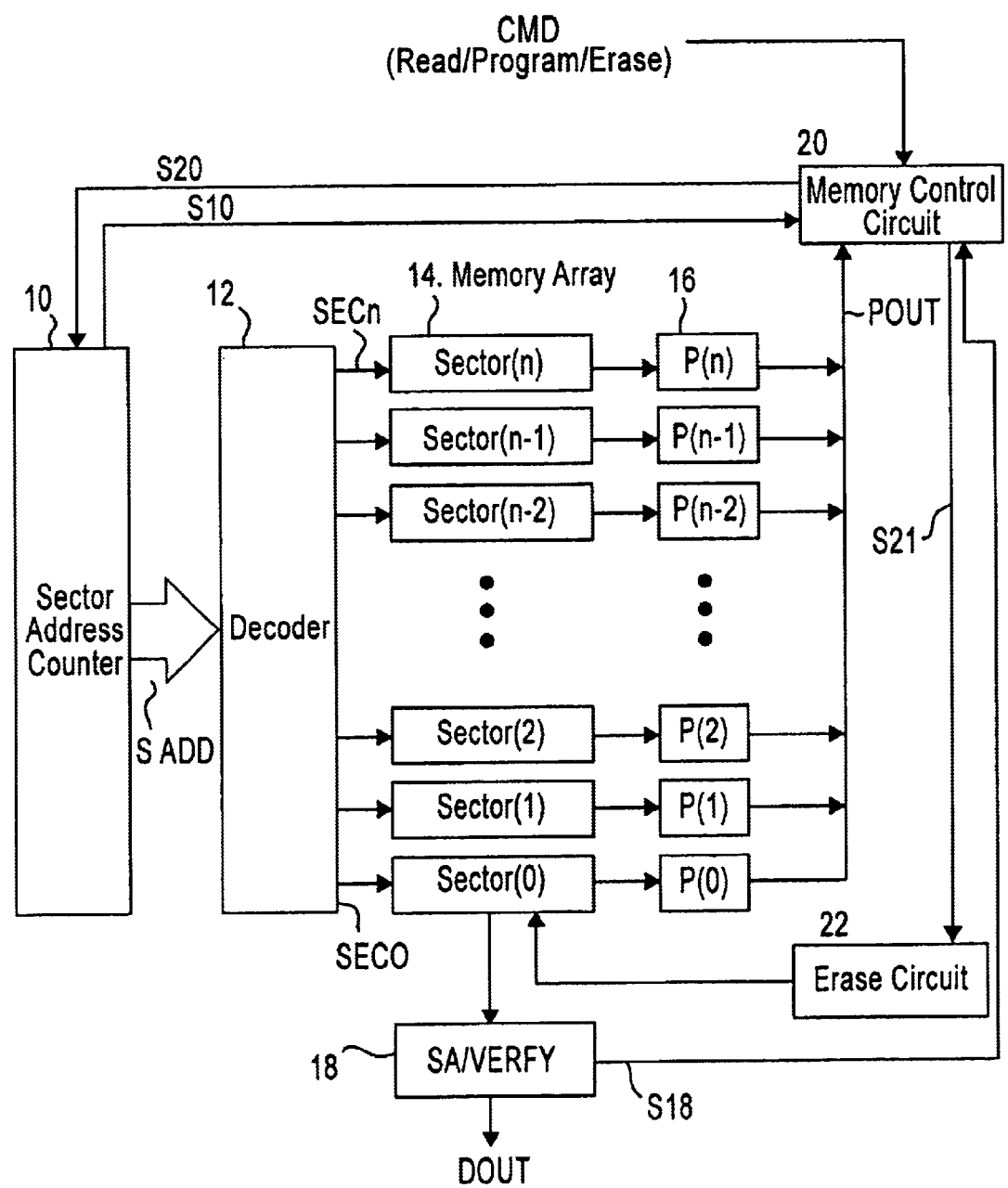
FIG. 1 is a schematic constitutional view of a conventional flash memory.
Figure 2:
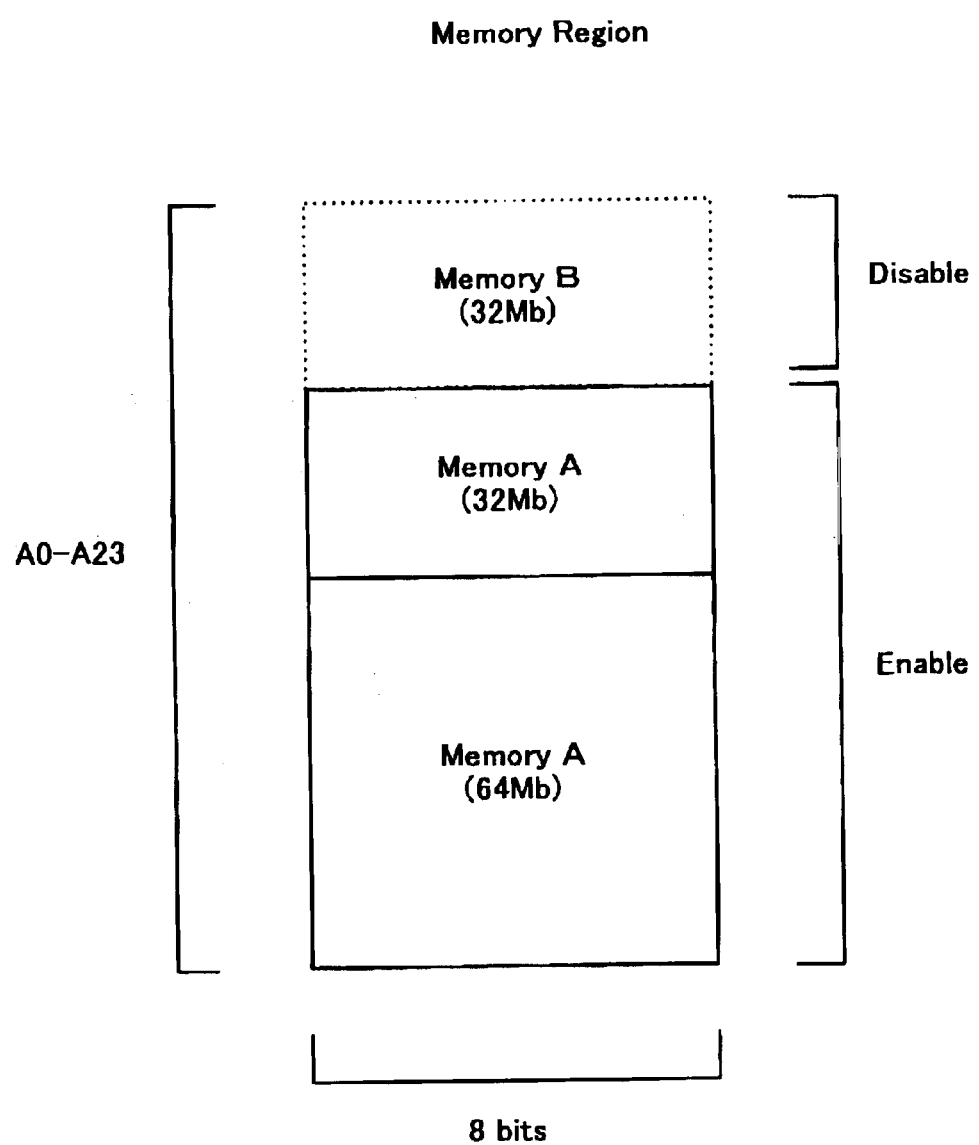
FIG. 2 shows a flash memory having a memory capacity that is not an exponentiated number of two.
Figure 3:
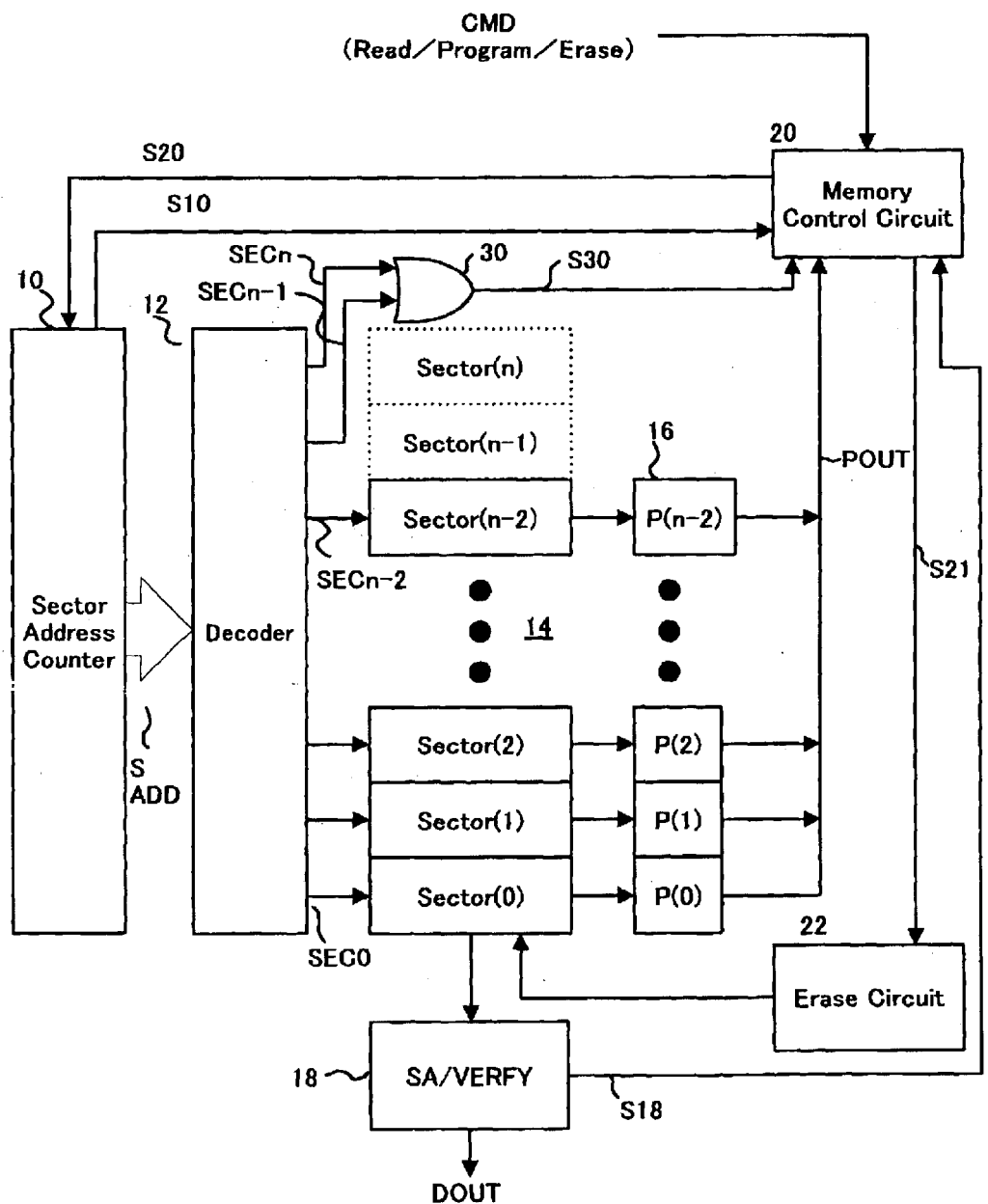
FIG. 3 is a schematic constitutional view of the flash memory of a first embodiment.

FIG. 3 is a schematic constitutional view of the flash memory of a first embodiment. Constituent elements which are the same as those of FIG. 1 have been assigned the same reference numerals. The memory arrays 14, which are memory regions, have a memory capacity of 12 megabytes (96 megabits) similarly to FIG. 2. In other words, the relation $2^{23}$=8 megabytes (64 megabits)<12 megabytes (96 megabits)<$2^{24}$=16 megabytes (128 megabits) is valid.

In cases where the memory capacity is not an exponentiated number of two and all the sectors have the same capacity, the number of sectors in the memory arrays 14 is not an exponentiated number of two either. Meanwhile, upon decoding a sector address SAdd of predetermined bits, the decoder 12 outputs sector select signals SEC0 to SECn which are of an exponentiated number of two. However, because the memory capacity is smaller than $2^{24}$ and larger than $2^{23}$, based on the sector address, some of the sector select signals (SECn, SECn−1 in the figure example) accordingly select the sectors (n), (n−1) which do not exist in the memory arrays 14.

Therefore, in the present embodiment, when the sector select signals SECn, SECn−1 which correspond to sectors (n), (n−1) that do not exist in the memory cell arrays 14 are generated, the sector select signals SECn, SECn−1 pass through an OR gate 30, whereupon a nonexistent sector select signal S30 is supplied to the memory control circuit 20. Therefore, while controlling an erase operation, the memory control circuit 20 is capable of detecting the selection of a sector that does not exist in the memory cell arrays. In other words, the OR gate 30 is a nonexistent sector selection detection circuit.

Figure 4:
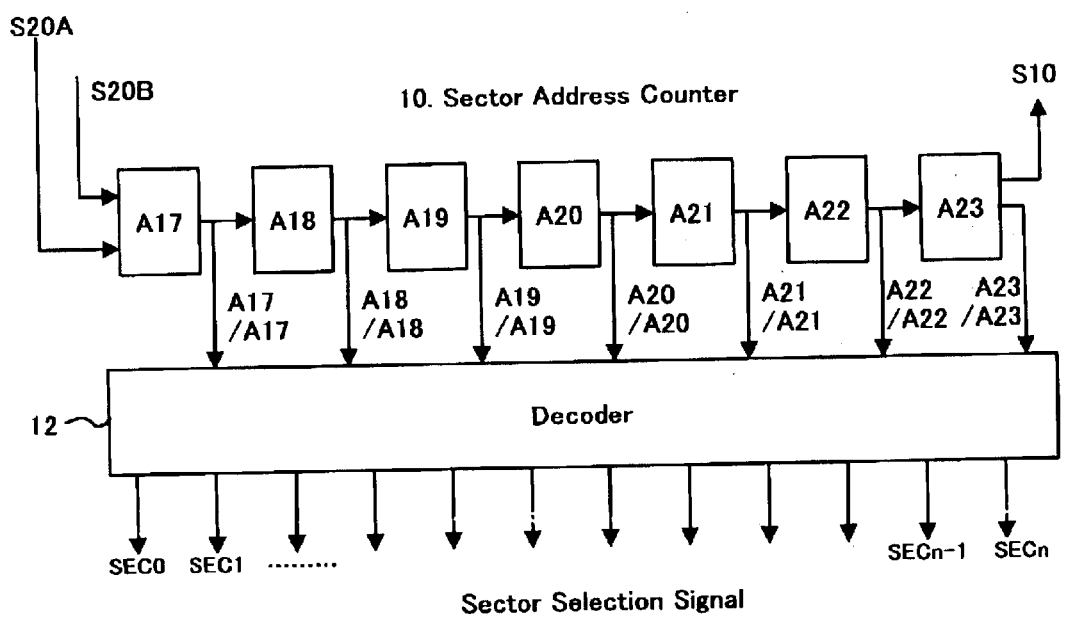
FIG. 4 shows a sector address counter and a decoder.

FIG. 4 shows a sector address counter and a decoder. The counter in FIG. 4 is a counter that generates sector addresses A17 to A23. After the counter value is reset to the maximum value or the minimum value by means of an initialize signal S20A, the counter value is decremented or incremented by means of a decrement signal or increment signal S20B respectively. Non-inverted address signals A17 to A23 and inverted address signals /A17 to /A23 are outputted from each bit of the counter. Then, when these address signals are decoded, the sector select signals SEC0 to SECn are generated.

Figure 5:
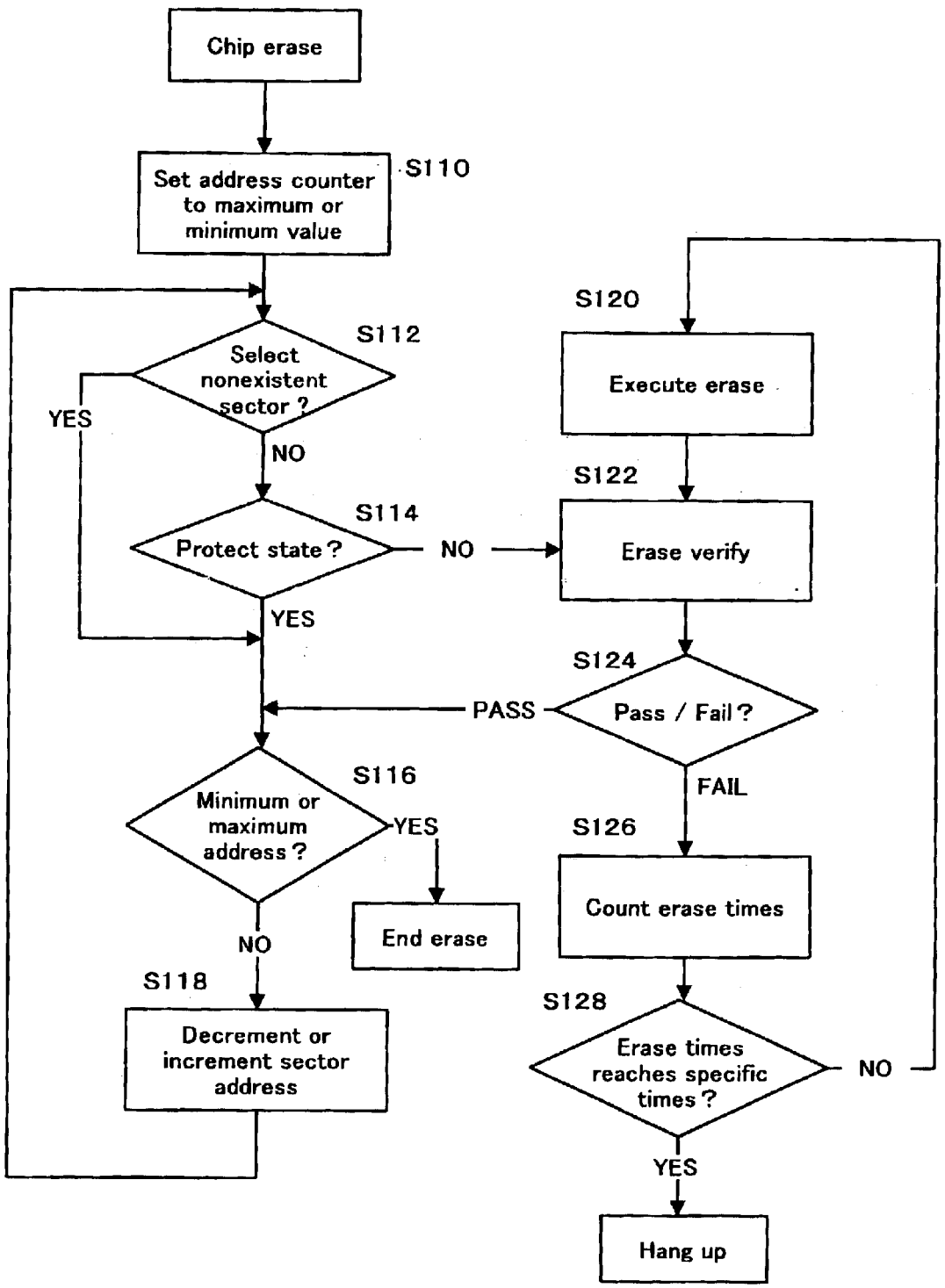
FIG. 5 is a flowchart for the chip-erase operation according to a first embodiment.

FIG. 5 is a flowchart for the chip-erase operation. This flowchart shows the operating procedures of the memory control device in FIG. 3. A description will be provided of the chip erase operation by following the flowchart, with reference to FIGS. 3 and 4.

First of all, the memory control circuit 20 resets the sector address counter 10 in response to a chip-erase command CMD. This resetting sets the address counter 10 to the maximum value or the minimum value (S110). The description which follows is for a case where setting is to the maximum value. As a result of this setting to the maximum value, the decoder 12 sets the sector select signal SECn to an activation level (high level).

The sector select signal SECn is a select signal corresponding to a sector that does not exist in the memory arrays 14, and the nonexistent sector signal S30 is supplied to the memory control device 20 by the OR gate 30. The memory control device 20 detects the fact that a nonexistent sector has been selected by means of the nonexistent sector signal S30, and does not perform an erase operation for this sector (S112). The memory control device 20 then decrements the sector address counter 10 by means of the decrement signal S20B (S118).

The decoder 12 accordingly sets the next sector select signal SECn-1 to the high level. In this case also, the nonexistent sector signal S30 is generated by the OR gate 30 and the memory control circuit 20 skips the erase operation with respect to this sector and then decrements the sector address counter.

Thereafter, the decoder 12 sets the next sector select signal SECn-2 to the high level to select the sector (n-2). Because this sector exists in the sector arrays 14, the nonexistent sector signal S30 is not generated. In response to this sector select signal SECn-2, the protection information which corresponds to this sector is read out from the protect memory 16. By means of the protect signal Pout thus read out, the memory control circuit 20 detects whether this sector is in a protected state or an unprotected state (S114). If the sector is in an unprotected state, the memory control circuit 20 proceeds with the erase operation for this sector, but in the case of a protected state, the memory control circuit 20 skips the erase operation with respect to this sector and decrements the sector address (S118).

In a sector erase operation, the verify circuit 18 detects whether or not the erasure of the memory cells in a sector is complete, and the memory control circuit 20 detects whether or not erasure is complete by means of the resulting verify signal S18 (S122, S124). In this erase verify step, a check is made of whether or not the erasure of all the memory cells in the selected sector is complete. When the erase verification does not yield a pass (S124), the erase times is counted (S126), and the erase operation is executed for as long as the erase times does not reach a specified times (S128).

The memory control circuit 20 supplies the erase signal S21 to the erase circuit 22 to cause same to apply an erasure voltage to all the memory cells in the selected sector such that the memory cells are subjected to erase stress (S120). As a result, the charge in the floating gate of a memory cell is extracted and the threshold voltage of the cell transistor drops. Thereafter, the above-described erase verification is conducted, and a check is performed of whether or not the erasure of all the memory cells in the selected sector is complete (S122, S124).

As described hereinabove, when the erasure of the cell transistors is complete, the respective threshold voltages thereof drop, and when a predetermined voltage is applied to the respective control gates of these cell transistors, cell currents are produced. By detecting the magnitude of these cell currents, the verify circuit 18 is able to detect whether or not erasure of these cells is complete.

The execution S120 of the above erase operation is repeated until the erase verification is passed by all of the cells in the sector. However, in cases where, even when the erase frequency reaches a specified frequency, the erase verification has still not yielded a pass, the sector is taken to be a defective sector and a hangup signal is generated.

Thereafter, the memory control circuit 20 sequentially selects sectors and repeats the erase operation for each sector. In this case, before an erase operation is performed, protection information for the sector is read out from the protect memory 16 to confirm whether this sector is in an erase-permitted state or an erase-prohibited state. If, the sector is in an erase-permitted state, the erase operation with respect to this sector is performed, but in the case of an erase-prohibited state, the erase operation with respect to this sector is not carried out.

Finally, when the sector address counter 10 reaches the minimum address, a signal S1 communicating this fact is supplied to the memory control circuit 20 to thereby end the chip-erase operation.

As described above, according to the present embodiment, the OR gate 30, which constitutes a circuit for detecting the selection of nonexistent sectors, is provided, and the selection of a sector that does not exist in the sector arrays 14 is communicated to the memory control circuit 20. The memory control circuit 20 is therefore capable of preventing the occurrence of a hangup state when an erase operation to a nonexistent sector is executed and an erase verification does not yield a pass.

Figure 6:
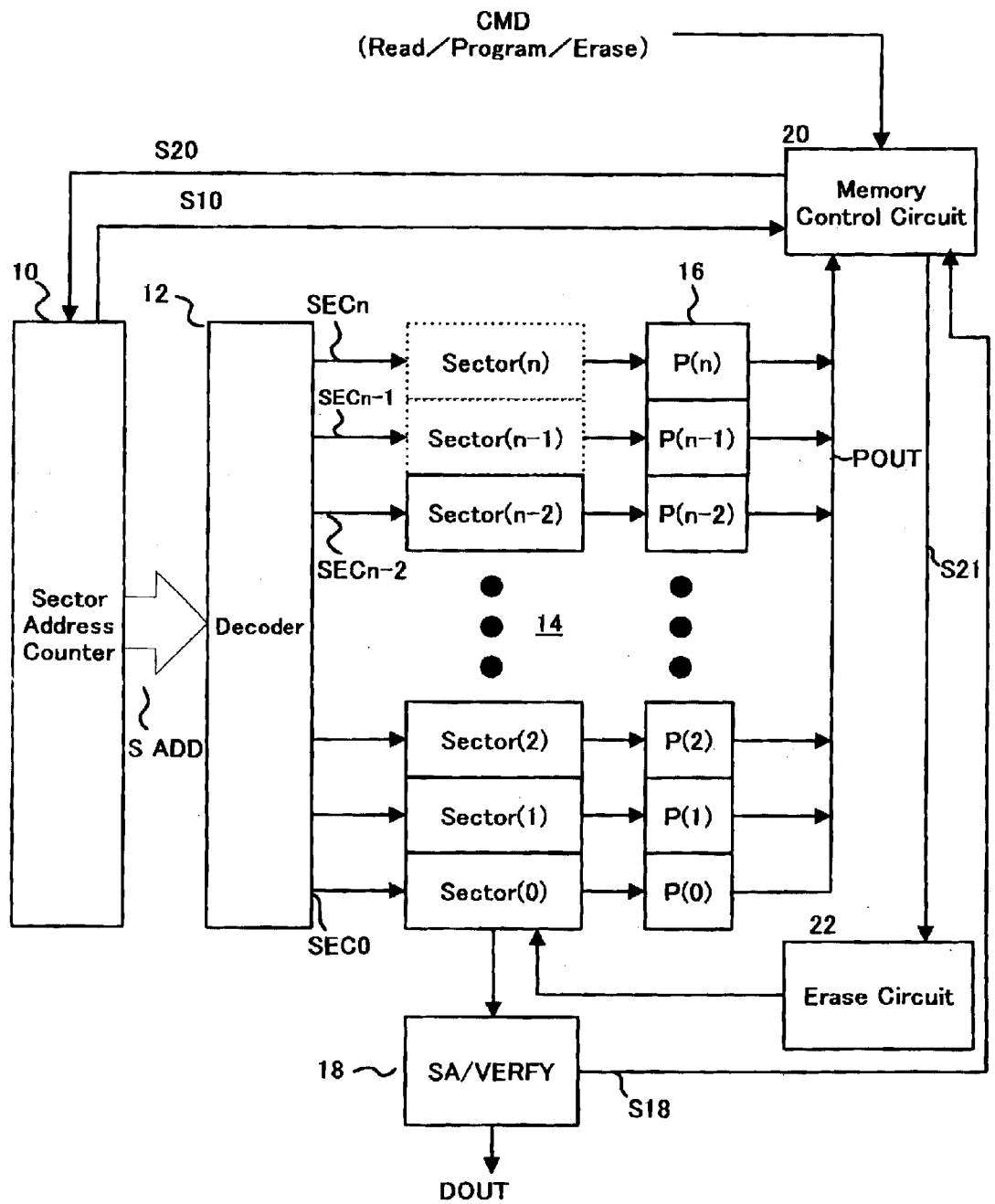
FIG. 6 is a schematic constitutional view of the flash memory of a second embodiment.

FIG. 6 is a schematic constitutional view of the flash memory of a second embodiment. Constituent elements which are the same as those of FIGS. 1 and 3 have been assigned the same reference numerals. According to this embodiment, a protect memory 16 is provided so as to correspond to all the sectors, that is, the sectors that exist in the sector arrays and the sectors that do not exist in the sector arrays. Further, the protect memory which corresponds to the existing sectors suitably stores protection information with respect to whether or not erasure of these sectors is permitted, and the protect memory which corresponds to the nonexistent sectors stores protection information which prohibits erasure thereof.

Moreover, at the time of an erase operation, by reading out the protection information which corresponds to the selected sector, the memory control circuit 20 detects whether or not a sector that exists in the sector arrays is in an erase-prohibited state by means of a protect signal Pout, similarly to the prior art, and detects, with respect to a sector that does not exist in the sector arrays, the fact that a nonexistent sector has been selected by means of the protect signal Pout. The memory control circuit 20 is therefore able to judge whether or not to skip the erase operation for this sector by means of the protect signal Pout alone.

Figure 7:
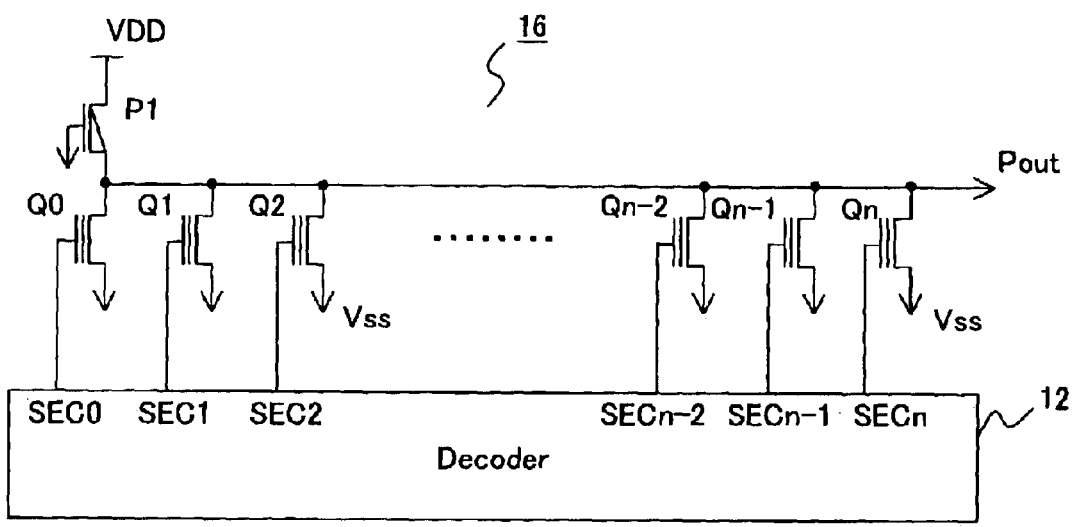
FIG. 7 is a circuit diagram of the protect memory in FIG. 6.

FIG. 7 is a circuit diagram of the protect memory in FIG. 6. The protect memory 16 comprises a p-channel transistor P1, and memory cell transistors Q0 to Qn which correspond to the sectors. The memory cell transistors Q0 to Qn have the same constitution as the memory cells in the cell arrays, and each comprises a floating gate, such that the injection of charge into the floating gate causes the threshold voltage to rise and the extraction of charge there from produces a drop in the threshold voltage.

The sector select signals SEC0 to SECn from the decoder 12 are supplied to the respective control gates of the memory cell transistors Q0 to Qn. If the sectors are in an erase-prohibited state (protected state), charge is stored in the respective floating gates of the memory cell transistors which correspond to these sectors and hence the respective threshold voltages are high. Hence, even if the sector select signals SEC0 to SECn are at the high level, the corresponding cell transistors do not conduct and the protect signals Pout thereof are at the high level. On the other hand, if the sectors are in an erase-permitted state (unprotected state), charge is not stored in the respective floating gates of the memory cell transistors which correspond to these sectors and hence the respective threshold voltages are low. Therefore, when the sector select signals are at the high level, these cell transistors conduct and the protect signals Pout thereof are at the low level.

Further, the protect memory which corresponds to sectors that do not exist in the sector arrays 14 stores protection information for an erase-prohibited state. Therefore, in the protect memory in FIG. 7, when the sector select signals SECn, SECn−1 are at the high level, the protect signals Pout thereof are both at the High level, and the memory control circuit 20 recognizes the fact that the corresponding sectors are in an erase-prohibited state.

Accordingly, usage of the protect memory allows the protect memory to store information with regard to whether or not the sectors which exist in the sector arrays are in an erase-prohibited state, as well as information indicating the sectors that do not exist in the sector arrays, such that the memory control circuit 20 is capable of checking whether or not an erase operation for these sectors should be skipped, by means of the protect signals Pout which are read out from the protect memory.

Figure 8:
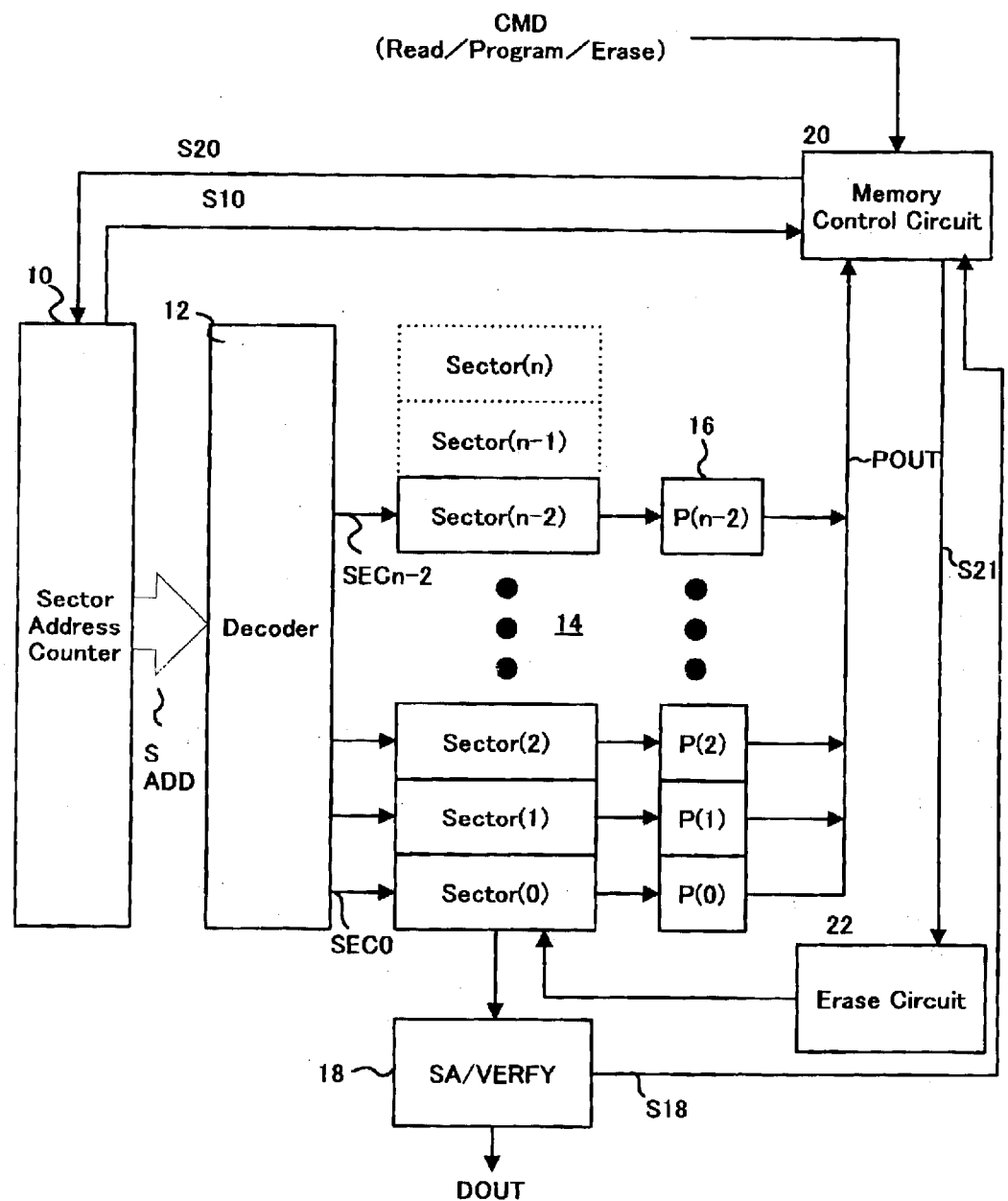
FIG. 8 is a schematic constitutional view of the flash memory of a third embodiment.
Figure 9:
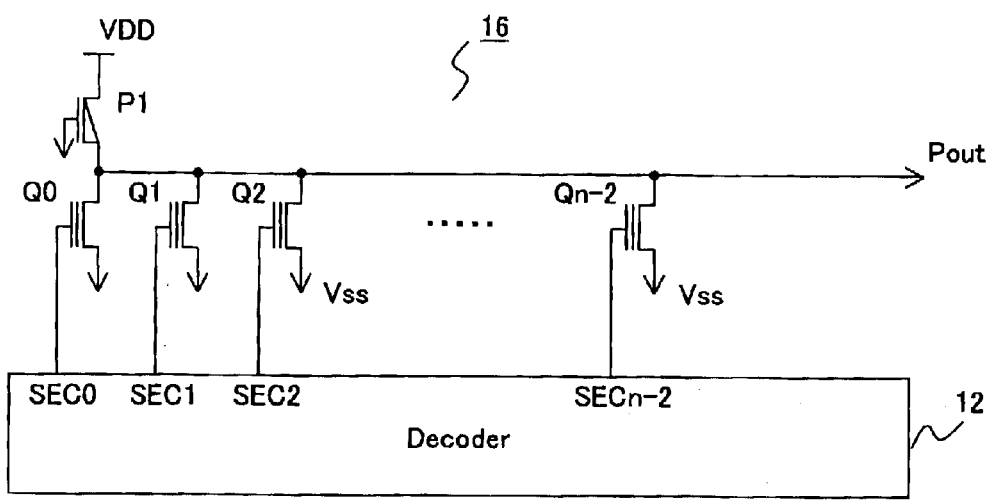
FIG. 9 is a circuit diagram of the protect memory in FIG. 8.

FIG. 8 is a schematic constitutional view of the flash memory of a third embodiment. Constituent elements that are the same as those in FIGS. 1, 3 and 6 have been assigned the same reference numerals. Also, FIG. 9 is a circuit diagram of the protect memory 16 in FIG. 8. In the third embodiment, when sectors that exist in the sector arrays 14 are selected, the protect memory 16 outputs protection information which corresponds to the selected sectors, and, when sectors that do not exist in the sector arrays 14 are selected, the protect memory 16 outputs respective protect signals Pout which are the same as those for the erase-prohibited state. More specifically, when all the sectors that exist in the sector arrays 14 are in a non-select state, the protect memory 16 outputs respective protect signals Pout that are the same as those for the erase-prohibited state.

As shown in FIG. 9, in the third embodiment, the protect memory 16 comprises memory cell transistors Q0 to Qn−2 that correspond to the sectors which exist in the sector arrays 14. Further, when sectors that exist in the sector arrays are selected, the protect memory 16 outputs protection information as the protect signals Pout in response to the corresponding sector select signals SEC0 to SECn−2. Also, when sectors that do not exist in the sector arrays are selected, the sector select signals SEC0 to SECn−2 all assume the low level, and the protect memory 16 outputs the high level which is the same as for the erase-prohibited state.

In other words, when all of the existing sectors are in a non-select state, the protect memory 16 relays the fact that nonexistent sectors have been selected to the memory control circuit 20 by means of high level protect signals Pout. The memory control circuit 20 accordingly then skips the erase operation for these sectors. Thus, in the present embodiment, at the time of a chip erase operation, because the decoder 12 includes a state which makes all the sectors that exist in the sector arrays assume a non-select state, during this state, high level protect signals Pout are outputted by the protect memory 16. The memory control circuit 20 is thus able to detect the fact that nonexistent sectors have been selected.

Figure 10:
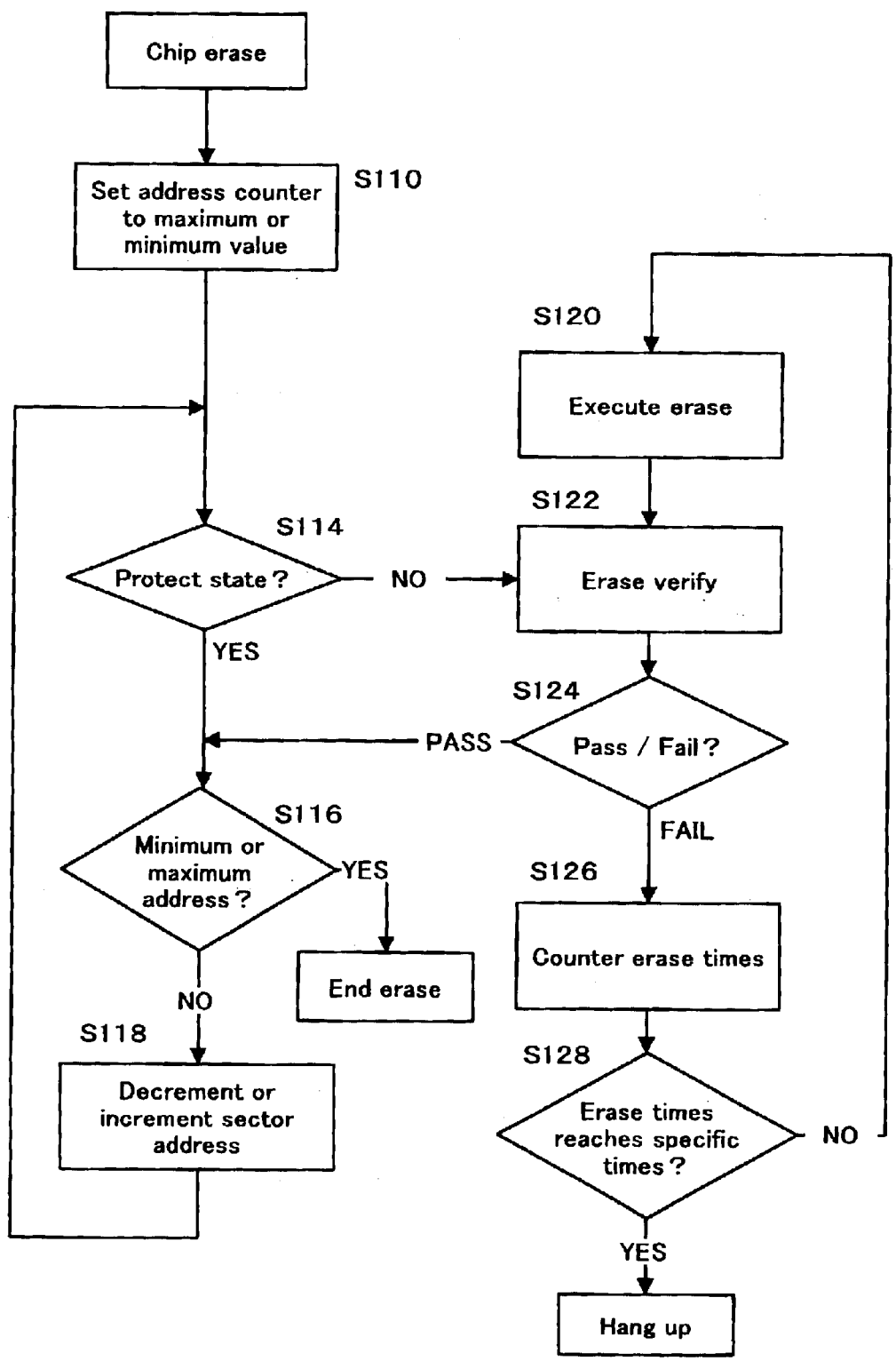
FIG. 10 is a flowchart for the chip-erase operation according to the second and third embodiments.

FIG. 10 is a flowchart for the chip-erase operation according to the second and third embodiments. In both the second and third embodiments, the selection of sectors that do not exist in the memory arrays 14 is detected by means of protect signals from the protect memory 16. Therefore, the step S112 in FIG. 5 for judging whether a nonexistent sector has been selected is not included in this flowchart. The flowchart is otherwise the same as that in FIG. 5. That is, the memory control circuit 20 reads the protect memory for the selected sector, detects whether or not this sector is in a protected state from the corresponding protect signal Pout, and, if the sector is in the protected state, the memory control circuit 20 skips the erase operation for this sector, and selects the next sector. The erase operation is the same as that in FIG. 5.

According to the present invention hereinabove, when the memory regions contain sectors of a number that is not an exponentiated number of two, even if sectors are selected by sequentially changing the sector address to execute an erase operation, when a sector that does not exist in the memory regions is selected, the erase operation is not performed, and, consequently, the occurrence of an erase error can be prevented.

What is claimed is:

1. A nonvolatile memory circuit including sectors containing a plurality of memory cells, comprising:

memory regions, which contain N (N is a plurality) of said sectors, N not being an exponentiated number of two;

a sector selection circuit for decoding a sector address and selecting a sector which corresponds to the sector address; and a memory control circuit which, in response to an erase command, executes an erase operation to the selected sector and, upon verifying that the erasure is complete, sequentially changes said sector address to select the next sector, wherein, when a sector that does not exist in said memory regions is selected, said memory control circuit selects the next sector without performing the erase operation to the nonexistent sector.

2. The nonvolatile memory circuit according to claim 1, further comprising:

a nonexistent sector selection detection circuit for detecting a selection of the sector that do not exist in said memory regions, wherein, in response to a nonexistent sector signal generated by the nonexistent sector selection detection circuit, said memory control circuit selects the next sector without performing the erase operation to the nonexistent sector.

3. The nonvolatile memory circuit according to claim 2, further comprising:

a protect memory for storing protection information which corresponds to said sectors and indicates whether or not the sectors are erase-permitted or erase-prohibited, wherein, in response to protection information indicating erase prohibition which is read out from said protect memory, said memory control circuit selects the next sector without performing the erase operation to the erase-prohibited sector.

4. The nonvolatile memory circuit according to claim 1, further comprising:

a protect memory for storing protection information which corresponds to said sectors and indicates whether or not the sectors are erase-permitted or erase-prohibited, and for outputting protection information that indicates said erase prohibition when a sector that does not exist in said memory regions is selected, wherein, in response to protection information indicating erase prohibition which is read out from said protect memory, said memory control circuit selects the next sector without performing the erase operation to the erase-prohibited sector.

5. The nonvolatile memory circuit according to claim 1, wherein said sector selection circuit includes a first state for selecting any of N sectors that exist in said memory regions and a second state for not selecting any of N sectors that exist in said memory regions.

6. The nonvolatile memory circuit according to claim 1, further comprising:

a sector address counter for generating said sector address, wherein said memory control circuit changes the sector address by incrementing or decrementing said sector address counter.

7. The nonvolatile memory circuit according to claims 1, wherein, in an erase operation with respect to a sector, said memory control circuit detects an erase error when it cannot be verified that the erasure is complete even after performing the erase operation a predetermined number of times.

8. A nonvolatile memory circuit including sectors containing a plurality of memory cells, comprising:

memory regions containing N ($2^{m-1}<N<2^m$, where m is an integer of two or more) of said sectors;

a sector selection circuit for decoding a sector address and selecting the sector which corresponds to the sector address;

a protect memory for storing protection information which corresponds to said sectors and indicates whether or not the sectors are erase-permitted or erase-prohibited; and a memory control circuit, which, in response to an erase command, executes an erase operation to the corresponding selected sector when protection information read out from said protect memory is in an erase-permitted state, and sequentially changes said sector address to thereby select the next sector when it is verified that the erasure is complete or when said read out protection information represents an erase-prohibited state, wherein, when a sector that exists in said memory regions is selected, said protection memory supplies protection information corresponding to the selected sector to said memory control circuit, and, when a sector that does not exist in said memory regions is selected, said protection memory supplies protection information of said erase-prohibited state to said memory control circuit.

9. The nonvolatile memory circuit according to claim 8, wherein said sector selection circuit includes a first case of selecting any of N sectors that exist in said memory regions and a second case of not selecting any of N sectors that exist in said memory regions; and, when all of said N sectors are in a non-select state, said protect memory supplies said protection information of said erase-prohibited state to said memory control circuit.

10. The nonvolatile memory circuit according to claim 8, wherein said protect memory stores protection information of $2^m$ bits, such that, when a sector that exists in said memory regions is selected, said protect memory supplies protection information corresponding to the selected sector to said memory control circuit, and, when a sector that does not exist in said memory regions is selected, said protect memory supplies protection information corresponding to the nonexistent sector to said memory control circuit, wherein protection information corresponding to the sector that does not exist in said memory regions represents an erase-prohibited state.

11. The nonvolatile memory circuit according to claim 8, further comprising:

a sector address counter for generating said sector address, wherein said memory control circuit changes the sector address by incrementing or decrementing said sector address counter.

12. The nonvolatile memory circuit according to any of claims 8, wherein, in an erase operation to a sector, said memory control circuit detects an erase error when it cannot be verified that the erasure is complete even after performing the erase operation a predetermined number of times.

* * * * *